United States Patent [19]

Deambrosio

[11] Patent Number: 5,044,542

[45] Date of Patent: Sep. 3, 1991

[54] SHIELD GAS WAVE SOLDERING

[75] Inventor: Carlos A. Deambrosio, Laprairie, Canada

[73] Assignee: Electrovert Ltd., La Prairie, Canada

[21] Appl. No.: 441,009

[22] Filed: Nov. 22, 1989

[51] Int. Cl.⁵ .................................................. B23K 3/00
[52] U.S. Cl. ........................................ 228/37; 228/42;
228/43; 118/421; 118/423; 118/429
[58] Field of Search .................. 228/33, 37, 42, 43,
228/46, 180.1, 180.2, 219, 262; 118/421, 423, 429

[56] References Cited

U.S. PATENT DOCUMENTS

| 3,921,888 | 11/1975 | Elliott et al. | 228/180 |
| 4,538,757 | 9/1985 | Bertiger | 228/180.1 |
| 4,580,716 | 4/1986 | Barresi et al. | 228/219 |
| 4,606,493 | 8/1986 | Christoph et al. | 228/180.1 |
| 4,684,056 | 8/1987 | Deambrosio | 228/180.1 |
| 4,696,226 | 9/1987 | Witmer | 432/242 |
| 4,697,230 | 10/1987 | Spigarelli et al. | 228/37 |
| 4,726,506 | 2/1988 | Kondo | 228/37 |
| 4,821,947 | 4/1989 | Nowotarski | 228/37 |
| 4,848,640 | 7/1989 | Gieskes | 228/37 |
| 4,848,642 | 7/1989 | Kondo | 228/37 |

FOREIGN PATENT DOCUMENTS

| 648531 | 9/1962 | Canada | 228/262 |
| 3309648 | 9/1984 | Fed. Rep. of Germany | |
| 8520254 | 12/1985 | Fed. Rep. of Germany | |
| 3737563 | 5/1989 | Fed. Rep. of Germany | |
| 95854 | 8/1978 | Japan | 228/219 |
| 27771 | 2/1984 | Japan | 228/37 |
| 174778 | 7/1988 | Japan | 228/219 |

OTHER PUBLICATIONS

IBM Technical Disclosure Bulletin, vol. 27, No. 11, p. 6395, Apr. 1985.
Lotsystem Mit Schutzgaslotzone, Hartmann et al., "Soft-Soldering Under Cover Gases", 11-1989.

Primary Examiner—Sam Heinrich
Attorney, Agent, or Firm—Darby & Darby

[57] ABSTRACT

A wave soldering apparatus and process occurs in an atmosphere which substantially excludes oxygen. By providing a pressurized effect on an element to be soldered while passing through a solder wave, fluxless soldering is accomplished avoiding the necessity to remove flux residues. The element is preheated in a shield gas atmosphere substantially excluding oxygen, moved in a predetermined path so that at least a portion of the element passes through the solder wave which is oscillated while the element is in the solder wave and maintained in the shield gas until solder on the element has solidified.

29 Claims, 3 Drawing Sheets

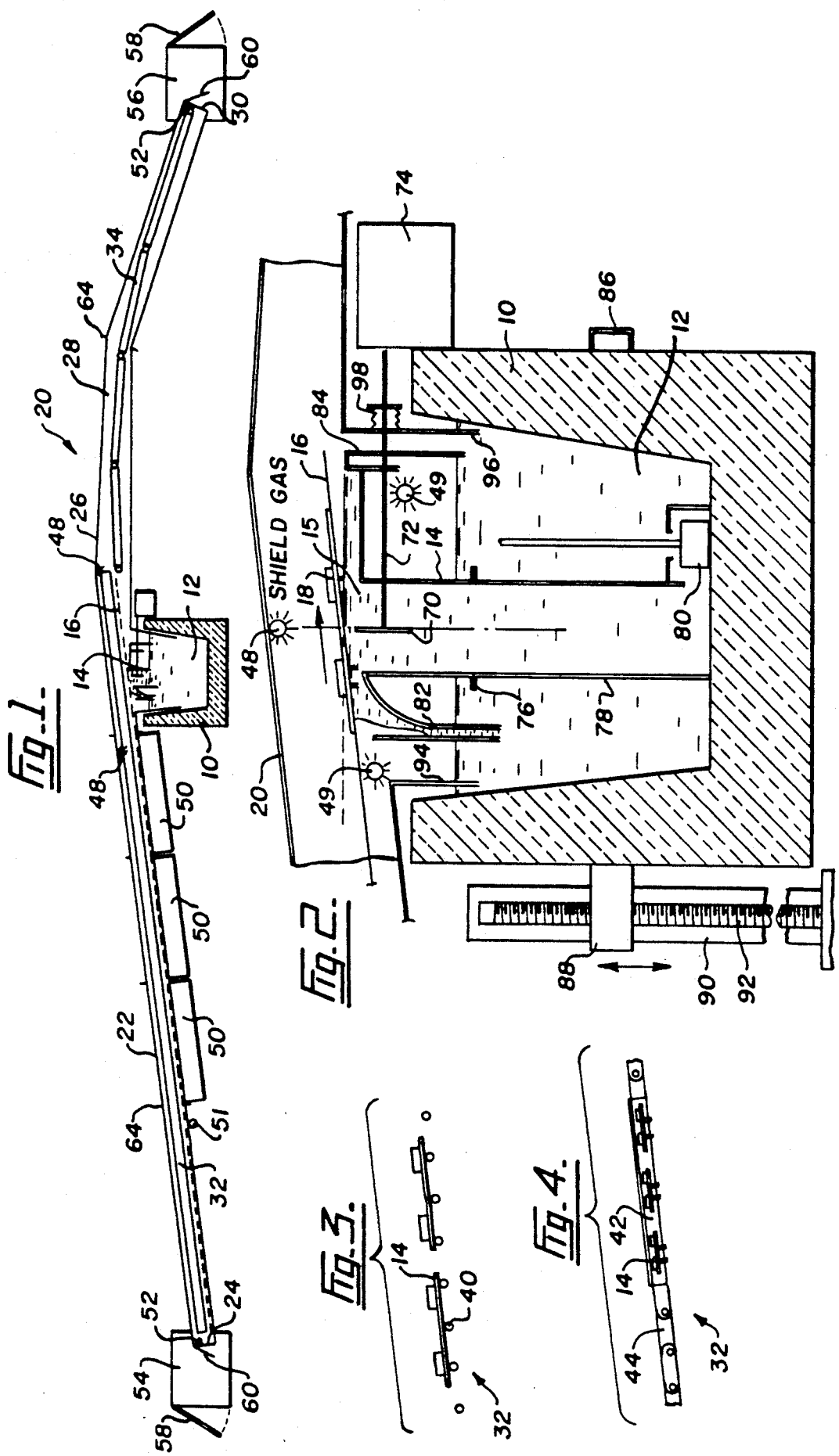

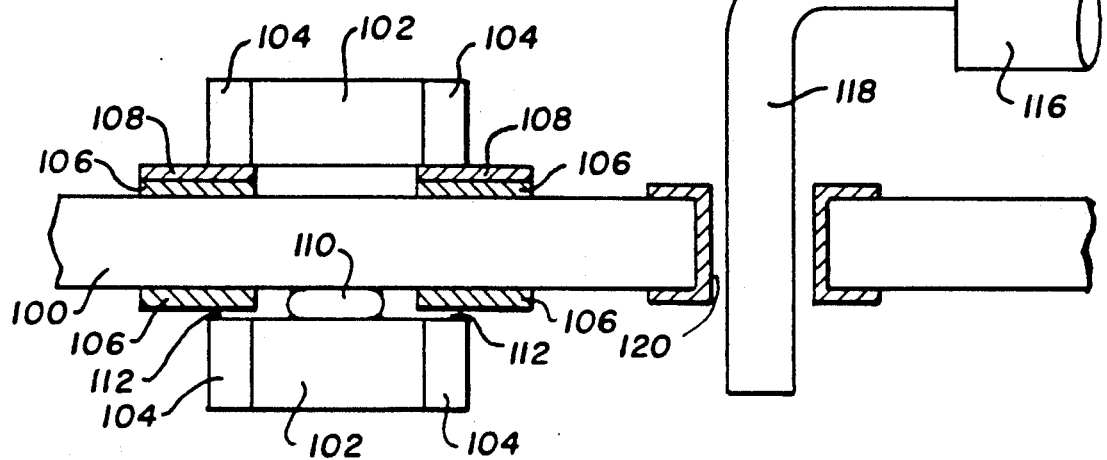
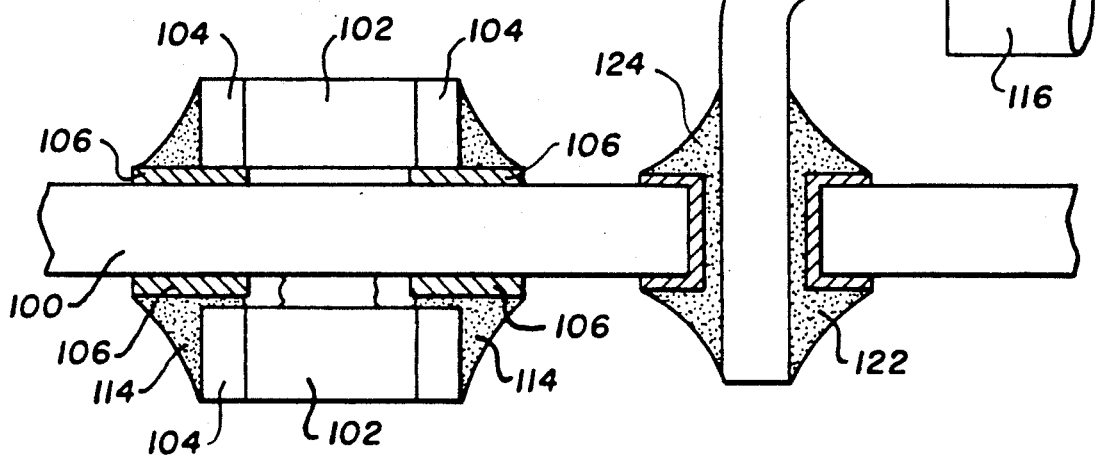

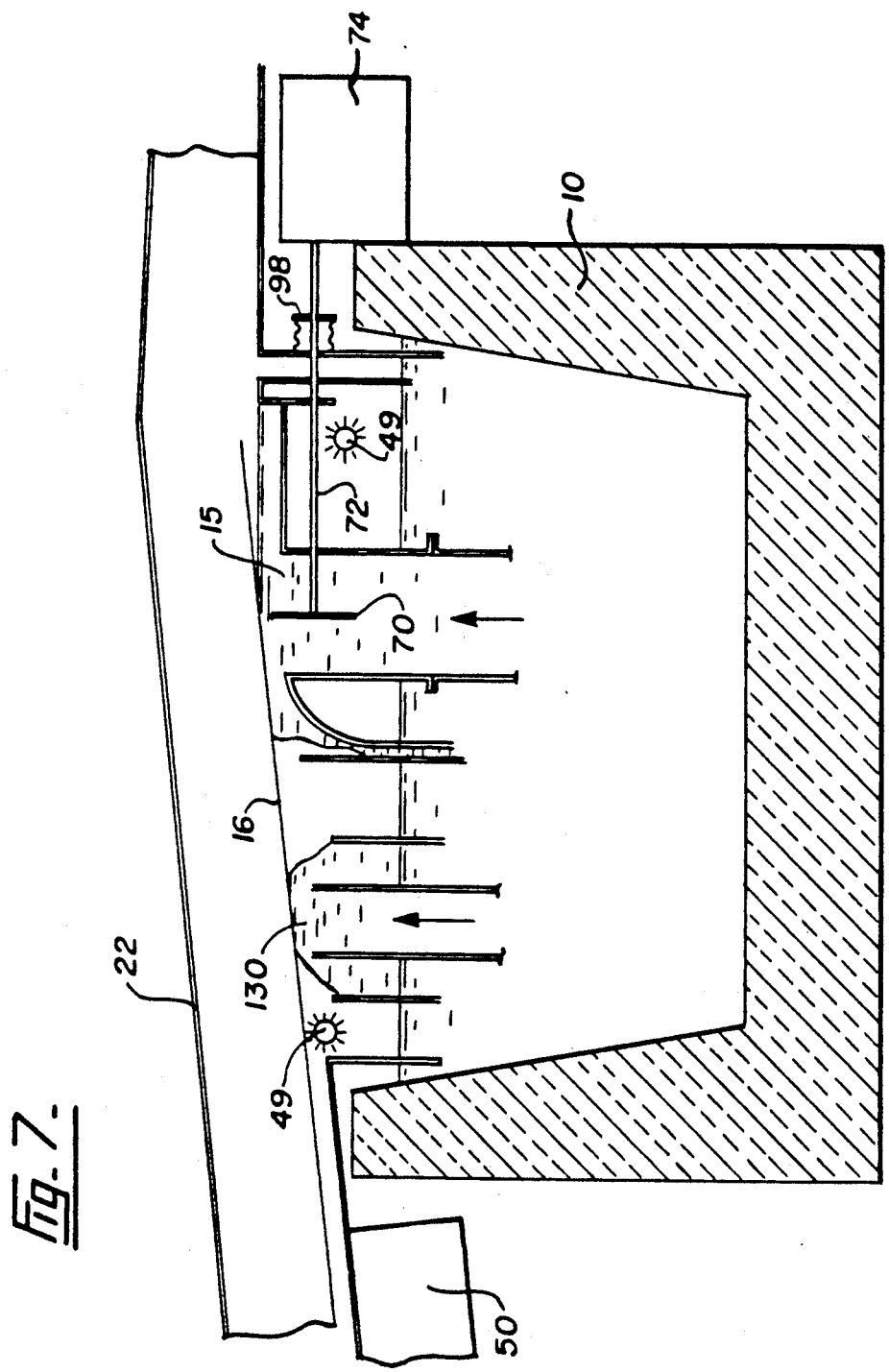

SHIELD GAS WAVE SOLDERING

BACKGROUND OF THE INVENTION

The present invention relates to wave soldering of elements such as printed wiring boards, and more specifically the present invention relates to wave soldering in an atmosphere which substantially excludes oxygen.

For many years wave soldering systems have required flux to promote wetting and good solder joints through removal of surface oxides on the metallic surfaces to be soldered, both on the circuit boards and on the component leads of printed wiring boards. More recently inert gas soldering, generally nitrogen gas and/or other inert gases, has shown some benefits in the reduction of the amount of flux required in soldering. The inert gases cover the liquid solder surfaces and prevent oxidation of the solder. By eliminating flux and still being able to prevent oxidation of the solder one avoids the necessity for cleaning after the soldering step and this is normally needed to remove the flux residues. Such an operation is expensive.

As well as inert gas, soldering has been conducted in an atmosphere which substantially excludes oxygen and this is the key to fluxless soldering. Forming gas which is a mixture of nitrogen and hydrogen has certain advantages for soldering in that it is purported to promote hole filling in circuit boards without the use of flux.

Soldering in a shield gas atmosphere substantially excluding oxygen is known. The gas permits fluxless soldering, for instance German patent publication Ser. No. DE 3309648 to Siemens shows the application of shield gas to a printed circuit board in a passage prior to soldering. German petty patent G 85 20 254.1 discloses soldering inside chambers which are filled with shield gas, the items to be soldered are transported on conveyors through these chambers. Vestibules at each end are shown to ensure that a minimum of shield gas escapes from the soldering chamber. German patent application DE 3737563 discloses another system wherein the elements pass in a tunnel-like housing. The housing has a number of curves in it so that the entry and the exit are below where the soldering occurs to ensure that shield gas remains within the tunnel.

Some of the features of shield gas soldering, often referred to as inert gas soldering, are disclosed in an article entitled Soft Soldering Under Cover Gases by H. J. Hartman. The system discloses reflow soldering as well as wave soldering.

One of the dificulties with shield gas soldering systems in fluxless soldering includes the problems of soldering circuit boards and the like which contain plated metallized holes, either with or without component leads which have to be filled with solder. The holes have metallized plating connecting the lower face of the circuit board with internal layers and/or a top layer. Without flux, it is found that with the preferred gas, nitrogen, the soldering operation does not promote the capillary rise or wetting of the solder from the solder wave to wick up the metallized plated hole, and this is an essential specification in the entire Electronics industry. Therefore at the present time additional conventional or liquid type low solids fluxes are required to ensure that the solder wicks up the metallized plate hole. By the addition of fluxes one again causes deposits to form on the soldered item, carries or pallets, if used, and on the liquid surface of a solder pot. This may require removing the flux deposit from the soldered item, and carries or pallets, if used. This may cause a layer to form on the solder pot which must be skimmed from time to time.

SUMMARY OF THE INVENTION

It is an aim of the present invention to provide a soldering system for printed circuit boards and the like which is fluxless and which has a capillary action for metallized holes through the face of a circuit board.

The present invention provides a process wherein the solder wave is oscillated in accordance with a vibratory wave soldering arrangement disclosed in U.S. Pat. No. 4,684,056 to Deambrosio. In this patent the solder wave is subjected to an oscillation or vibration during a passage of a printed wiring board therethrough. The oscillation or vibration aids in filling the small holes in the boards, crevices and corners adjacent to a solder mask and all other areas where solder wetting is difficult to achieve conventional machines. Furthermore, by conducting the soldering in a shielded atmosphere substantially excluding oxygen, truly fluxless soldering can occur and the solder appears shiny and has little or no dross formed, as oxygen is excluded from the process.

The present invention provides a process for wave soldering an element comprising the steps of preheating the element in a shield gas atmosphere substantially excluding oxygen; moving the element in a pedetermined path; forming at least one solder wave beneath the path so that at least a portion of the element passes through the solder wave while maintaining liquid solder surfaces exposed to the shield gas; producing an oscillation in the solder wave during passage of the element therethrough, and maintaining the element in the shield gas atmosphere until solder on the element has solidified.

Also provided in the present invention is a process for wave soldering an element comprising the steps of preheating the element in a shield gas atmosphere substantially excluding oxygen; moving the element in a pedetrmined path forming at least one solder wave beneath the path so that at least a portion of the element passes through the solder wave while maintaining liquid solder surface exposed to shield gas; providing a pressurized effect on the element using a moving device within the solder wave during the passage of the element therethrough, and maintaining the element in the shield gas atmosphere until solder on the element has solidified.

The pesent invention also provides an apparatus for wave soldering an element comprising an enclosure for a shield gas atmosphere substantially excluding oxygen with an entry for an element and an exit for the element; means for maintaining the shield gas atmosphere within the enclosure; a preheating portion in the enclosure with means to preheat the element therein; means for forming at least one solder wave in the enclosure after the preheating portion; means for moving the element in a predetermined path through the enclosure from the entry to the exit, the path ensuring at least a portion of the element passes through the solder wave; oscillating means to produce oscillations in the solder wave during the passage of the element therethrough, and a cooling portion in the enclosure after the solder wave, adapted to allow solder on the element to solidify in the shield gas atmosphere.

The means for maintaining the shield gas atmosphere in the enclosure includes forming the enclosure with an apex so that entry and exit are at a lower elevation, and the shield gas is lighter than air thus no doors are necessary. Other means include doors, gates, vestibules or gas curtains.

In still a furhter embodiment there is also provided an apparatus for wave soldering an element comprising an enclosure for a shield gas atmosphere excluding oxygen with an entry for an element and exit for the element; means for maintaining the shield gas atmosphere within the enclosure; a reservoir within the enclosure adapted to contain molten solder; at least one discharge nozzle facing upwards positioned above the reservoir; pump means for forming a solder wave from the nozzle; means for moving the element in a predetermined path through the enclosure from the entry to the exit, the path ensuring at least a portion of the element passes through the solder wave, and oscillating means to produce oscillations in the solder wave during the passage of the element therethrough.

BRIEF DESCRIPTION OF THE DRAWINGS

In drawings which illustrate embodiments of the present invention by way of example, FIG. 1 is a side elevational view showing a solder pot and enclosure suitable for the process of the present invention.

FIG 2 is a detailed side view of the solder pot shown in FIG. 1.

FIG. 3 is a detailed side view of a finger conveyor suitable for conveying elements through the enclosure.

FIG. 4 is a detailed side view of a pallet containing elements to be soldered supported by a coveyor.

FIG. 5 is a detailed side view of a section of a circuit board prior to soldering.

FIG. 6 is a detailed side view of the circuit board shown in FIG. 5 after soldering.

FIG. 7 is a detailed side view of a solder pot similar to that shown in FIG. 1 with the addition of a further solder wave nozzle.

DETAILED DISCLOSURE OF THE INVENTION

One embodiment of an apparatus for wave soldering according to the present invention is shown in FIGS. 1 and 2. An insulated solder pot 10 contains solder 12 in liquid form and a solder nozzle 14 project a solder wave 15 up about the solder pot 10 into a coveyor path 16 on which moves elements 18 as circuit boards and other electronic devices. The soldering occurs within an enclosure 20 which contains a shield gas substantially excluding oxygen. The enclosure 20 has substantially two tunnels a first portion 22 extending up from an entry 24 to an apex 26 which is adjacent to the solder pot 10, and a second portion 28 which extends down to an exit 30. Preheating of the elements is shown occurring in the first portion 22 of the tunnel 20, although in certain circumstances preheating may not be needed or may occur from a first solder wave. Cooling occurs to the elements 18 in the second portion 28 of the tunnel. The cooling is sufficient to allow the solder to solidify. In most cases there is no need for special cooling systems such as coils within the second portion 28. The entrance 24 and the exit 30 are perferably on the same elevation so that the shield gas, which in a preferred embodiment is nitrogen and lighter than air, remains in the enclosure 20 and does not escape from the entry 24 or exit 30. The nitrogen or other shield gas within the enclosure 20 has a lower density than ambient air an hence assists in retaining the gas in the enclosure 20. A first conveyor 32 is positioned in the first portion 22 of the tunnel 20. The first conveyor 32 moves the elements 18 in the path 16 from the entry 24 through the solder wave 15 to approximately the apex 26 of the enclosure 20. The elements 18 are then depositied on a second conveyor 34 which takes them through the second portion 28 of the tunnel 20 to the exit 30. A flat belt conveyor or other suitable conveyor may also be used.

FIG. 3 shows the first conveyor 32 in the form of a conveyor with a series of finger elements 40 which support the elements 18. FIG. 4 shows another embodiment of the first conveyor 32 wherein the elements 18 are supported in a pallet 42 which in turn is held by conveyor chain 44 at least on one side of the solder pot 10. The pallet 42 with elements 18 therein, is deposited on the second conveyor 34 and moved to the exit 30. A flat belt conveyor, or other suitable conveyor may also be used.

A shield gas diffuser 48 is shown above the conveyor 32 over the solder pot 10 in FIG. 2 and two shield gas diffuser 49 on each side on the solder wave below the conveyor 32. FIG. 1 shows 2 shield gas diffusers above the conveyor 32 on each side of the solder pot 10. The shield gas is preferably in contact with the solder surface at all times when it is liquid.

In one embodiment formic acid in gaseous form is added to the shield gas prior to feeding into the enclosure 20. The shield gas is bubbled through liquid formic acid and the gaseous mix is fed out through the diffusers 48 and 49. The formic acid assists in eliminating and preventing dross that may be presnt in the solder, and helps to keep the solder clean. Other additives may be added to the shield gas, acetic acid also assists in removing dross and oxides on a circuit board.

Panel heaters 50 are shown below the first conveyor 32 in the first portion 22 of the tunnel 20. Whereas the panel heaters are shown only below the tunnel 20, it will be apparent that they may also be placed above or on both sides of the tunnel 20 or even in the tunnel 20. The heaters may be IR panel heaters or other suitable types of heaters, and preheat the elements 18 prior to wave soldering. The preheating of the elements 18 occurs within the first portion 22 of the tunnel 20 before soldering. By heating in a shield gas atmosphere, there is little or no oxygen remaining in the holes and crevices of the elements 18.

In another embodiment, adipic acid is added to the elements 18 prior to heating, The adipic acid in solution form is preferably sprayed onto the elements from nozzle 51. The nozzle 51 is preferably located below the conveyor 32, and sprays upwards to clean any oxides present on circuit boards or the like. It is found in some circumtances the adipic acid solution enhances capillary action of holes in the boards. The adipic acid may also be applied by foaming brush application or other suitable applications. Whereas adipic acid is disclosed, other gaseous or acidic additives may also be added to perform the same function.

In one embodiment a shield gas jet curtain 52 is positioned at the entry 24 and another at the exit 30. This prevents air from entering with the elements 18 on the first conveyor 32. In a further embodiment an entry vestibule 54 and an exit vestibule 56 are provided. Each vestibule has an outside door 58 to allow elements 18 to be loaded into the entry vestibule 54 and removed from the exit vestibule 56. A further door or gate 60 is provided over the entry 24 and the exit 30. These doors are closed when the outer doors 58 of the vestibules are open and then opened when the outer doors 58 are closed. Provision is provided to evacuate the vestibules 54 and 65 when both doors 58 and 60 are closed to remove the air or shield gas, thus avoiding air entering the enclosure 20, or shield gas escaping into the atmosphere. Thus shield gas does not easily escape from the enclosure 20. The exit and entry doors 60 may be provided in some instances without the vestibules 54 and 56.

In one embodiment, provision is made to vary the slope of the conveyor 32 so that the path 16 where the elements 18 pass through the solder wave 15 can be varied for process adjustments. For example, if the angle is steep then solder drains more quickly from the board. In another embodiment it is preferred to have the path 16 substantially horizontal as appropriate for soldering.

The enclosure 20 may be made as a one piece construction made of sheet metal, but in a peferred embodiment is made in segments and flanges 64 are shown at places along the enclosure 20 to show where it is segmented. In another embodiment wherein the first portion 22 of the tunnel is articulated to adjust the slope of the first conveyor 32, then an articulated joint is provided which is gas proof and prevents shield gas escaping at the apex.

The solder pot assembly 10 has a solder nozzle arrangement similar to that shown in U.S. Pat. No. 4,684,056 with a vibrating vane 70 in the form of a flat strip positioned in the nozzle 14 and the connecting rod 72, which in a larger solder wave is two or three rods, extends through an aperture in the exit side of the nozzle 14 to a vibrator 74 mounted on the outside of the solder pot 10. The frequency and/or amplitiude of vibration is controllable by the vibrator 74. The vibration is preferably in the range of about 20 to 400 Hz and occurs during the passage of the element 18 through the solder wave 15. This vibration does not substantially change the configuration of the solder wave and is hardly visible to the eye other than a slight shimmer.

Whereas the vane 70 is shown to vibrate backwards and forwards in substantially the same plane of movement as the elements 18. It will be apparent that the vane could be mounted across the solder wave. Other embodiments are disclosed in U.S. Pat. No. 4,684,056. Other types of devices to provide a pressurized effect on the elements 18 from the solder wave 15 such as wave makers, rotating pulsing devices may also be used.

The solder wave nozzle 14 is connected by means of a flange 76 to a solder conduit 78, which in turn is connected to a pump 80 for pumping solder 12 from the solder pot 10 up through the nozzle 14. The entry side of the nozzle 14 has a guide 82 to provide a downward sloping path for a portion of the solder. The exit solder wave flows to a weir plate 84 to provide a solder wave configuration similar to that shown in U.S. Pat. No. 4,684,056. The solder pot 10 is supported by a bracket 86 which in turn has an arm 88 connected to a post 90. The post has a screw thread arrangement 92 which may be rotated to lower the solder pot 10 and swing it out from underneath the enclosure 20 for maintenance purposes.

The solder pot 10 has an entry skirt 94 which is attached to the lower surface of the first portion 22 of the tunnel 20 and an exit skirt 96 which is attached to the lower surface of the second portion 22 of tunnel 20. The skirts extend around all four sides of the opening in the lower surface of the first portion 22 of the tunnel 20. The skirts are sealed at the four corners, so no shield gas can escape. The skirts 94 and 96 are sealed tightly to the tunnel and extend down into the solder 12 in the solder pot 10 and thus provide a liquid seal in the solder pot 10 to prevent inert gas from escaping downwards. The skirts 94 and 96 are also used if the first conveyor 32 has an adjustable slope. As movement of the skirts 94 and 96 within the solder pot 10 do not affect the seal provided the skirts do not rise above the level of the solder 12. A bellows type seal 98 surrounds the connecting rod 72 as it passes through the skirt 96 so that shield gas is contained within the enclosure. The seal 98 permits the rod to vibrate.

Some circuit boards may have chips and other components attached to both sides of a board and in such conditions reflow soldering may be used together with wave soldering. FIG. 5 illustrates a section of a circuit board 100 having surface mounted components 102 on the top and bottom. Solderable terminals 104 need to be soldered to metallic circuit pads 106 leading to circuit within the board 100. In the case of the top mounted component 102, solder paste 108 is preapplied to the top pads 106. An adhesive 110 holds the bottom component 102 to the board 100, and a hard to solder area remains between the terminals 104 and the pads 106. Although a gap 112 is shown between the terminals 104 and the pads 106, most of the time the two are touching.

The circuit board 100 passes into the enclosure 20 containing a shield gas, and heaters, generally infrared heaters, heat the board from above causing the solder paste 108 to melt and flow. The board 100 then passes through the board with the vibratory solder wave 15 forming the solder joints 114 as shown in FIG. 6.

A leaded component 116 has a lead 118 passing through a metallized plated hole 120 as shown in FIG. 5. The solder applied by the vibratory solder wave 15 forms the solder joint 122 as shown in FIG. 6 exhibiting efficient hole filling including the desired top-side fillet 124.

In certain soldering devices, two or more waves may be used either from a single solder pot or from different solder pots. The waves may be turbulent or smooth. In some instances the first wave may be turbulent and upstream of a second smooth we comprising the vibratory device. In another embodiment a first wave may be at a lower temperature to reduce thermal shock. FIG. 7 illustrates a first solder wave 130 upstream of the solder wave 15. The first solder wave 130 is a turbulent solder wave and is in the same solder pot 10 as the solder wave 15. The latter wave being a smooth solder wave with the vibrating wave 70 therein.

Dross formation is virtually eliminated on the solder surface in the pot 10 and within the enclosure 20 provided the shield gas atmosphere is maintained therein. The solder wave 15 is strikingly bright and clear due to the lack of oxygen, and it is found that this lack of oxygen reduces the number of bridges and icicles. The supplementary pressurized effect produced by the vibration of the solder wave promotes solder wetting of metallized and plated holes in circuit boards and the like. This results in complete hole filling without the need of flux. In operation the elements such as circuit boards and other elements are preheated in a shield gas atmosphere excluding oxygen prior to being soldered and then are permitted to cool in the shield gas atmosphere so that no liquid solder is exposed to oxygen or air. No flux is required, although the addition of substances to reduce dross or other impurities in the solder pot may be used as required. There may be certain soldering applications including difficult board designs or certain metallic surfaces where flux would enhance soldering results.

Various changes may be made to the embodiments shown herein without departing from the scope of the present invention which is limited only by the following claims.

Whereas two conveyors are illustrated in FIG. 1, a first conveyor 32 for conveying elements 18 through the solder wave 15, and a second conveyor 34 for transporting the elements 18 to the exit 30, a single conveyor may be used from entry 24 to exit 30 or more than two conveyors may be used.

Results of utilizing a vibratory wave in a shield gas atmosphere provided satisfactory soldering without fluxing. The vibratory wave eliminated gas bubbles trapped and formed adjacent component leads and areas surrounding the leads, and solder reached all crevasses and corners. The shield gas atmosphere enhanced capillary action in the board holes so the solder rose up the component leads. The fluxless solder and the nitrogen atmosphere appeared to have a pulsing pressure from the vibratory wave which caused a washing action to occur and aided in removing oxides from the board or elements.

The embodiments of the present invention in which an exclusive property or privilege is claimed are defined as follows:

1. An apparatus for wave soldering an element comprising,
   an enclosure for a shield gas atmosphere substantially excluding oxygen with an entry for an element and an exit for the element;
   means to maintain the shield gas atmosphere within the enclosure;
   a preheating portion in the enclosure adjacent the entry with means to preheat the element therein;
   means for forming at least one solder wave in the enclosure after the preheating portion;
   means for moving the element in a predetermined path through the enclosure from the entry to the exit, the path ensuring at least a portion of the element passes through the solder wave;
   oscillating means to produce oscillations in the solder wave during the passage to the element therethrough, the frequency of oscillations being in the range of about 20 to 400 Hertz, and
   a cooling portion in the enclosure after the solder wave, adapted to allow solder on the element to solidify in the shield gas atmosphere.

2. The apparatus for wave soldering an element according to claim 1 wherein the enclosure comprises a tunnel to transport the element therethrough on a conveyor means, the tunnel having an apex substantially adjacent the solder wave with an entry portion on one side of the apex and an exit portion on the other side of the apex, and wherein the entry portion and the exit portion are both sloped with the entry and the exit at substantially the same elevation.

3. The apparatus for wave soldering an element according to claim 2 including gas jet curtains at the entry and the exit.

4. The apparatus for wave soldering an element according to claim 2 wherein the conveyor means to move the element in the path is adjustable to vary the angle of the path.

5. The apparatus for wave soldering an element according to claim 2 including a vestibule located at the entry to the tunnel, the vestibule having a first door to place the element therein and a second door at the entry to the tunnel.

6. The apparatus for wave soldering an element according to claim 15 including a vestibule located at the exit from the tunnel, the vestibule having a first door at the exit from the tunnel, and a second door for removing the element.

7. The apparatus for wave soldering an element according to claim 2 wherein the tunnel is formed in sections.

8. The apparatus for wave soldering an element according to claim 1 wherein a second means to form a solder wave is provided upstream of the first solder wave.

9. The apparatus for wave soldering an element according to claim 1 including means for introducing an additive into the shield gas atmosphere.

10. The apparatus for wave soldering an element according to claim 1 including means of introducing an acid additive to the enclosure.

11. An apparatus for wave soldering an element comprising,
    an enclosure for a shield gas atmosphere substantially excluding oxygen with an entry for an element and an exit for the element;
    means to maintain the shield gas atmosphere within the enclosure;
    a preheating portion in the enclosure adjacent the entry with means to preheat the element therein;
    spray means to spray adipic acid onto the element before the preheating portion;
    means for forming at least one solder wave in the enclosure after the preheating portion;
    means for moving the element in a predetermined path through the enclosure from the entry to the exit, the path ensuring at least a portion of the element passes through the solder wave;
    oscillating means to produce oscillations in the solder wave during the passage of the element therethrough, the frequency of oscillations being in the range of about 20 to 400 Hertz, and
    a cooling portion in the enclosure after the solder wave, adapted to allow solder on the element to solidify in the shield gas atmosphere.

12. An apparatus for wave soldering an element comprising
    an enclosure for a shield gas atmosphere substantially excluding oxygen with an entry for an element and an exit for the element;
    means to maintain the shield gas atmosphere within the enclosure;
    a reservoir within the enclosure adapted to contain molten solder;
    pump means for forming a solder wave from the nozzle;
    means for moving the element in a predetermined path through the enclosure from the entry to the exit, the path ensuring at least a portion of the element passes through the solder wave, and
    oscillating means to produce oscillations in the solder wave during the passage of the element therethrough, the frequency of oscillations being in the range of about 20 to 400 Hertz..

13. The apparatus for wave soldering an element according to claim 13, including means for introducing an acid additive to the enclosure.

14. The apparatus for wave soldering an element according to claim 13 wherein the enclosure is in the form of a tunnel, and including conveyor means to transport the element in the path within the enclosure from the entry to the exit.

15. The apparatus for wave soldering an element according to claim 15 wherein the tunnel has an apex adjacent the discharge nozzle, and the tunnel slopes down to the entry in one direction and to the exit in the other direction, the entry and the exit being at substantially the same elevation.

16. The apparatus for wave soldering an element according to claim 15 including means for lowering and raising the solder reservoir relative to the conveyor means.

17. The apparatus for wave soldering an element according to claim 13 wherein the tunnel has a preheating portion before the solder reservoir and a cooling portion after the solder reservoir.

18. The apparatus for wave soldering an element according to claim 13 wherein the path through the solder wave is variable from an inclined slope to a substantially horizontal position.

19. The apparatus for wave soldering an element according to claim 13 wherein the conveyor means comprises a conveyor for supporting a plurality of finger elements.

20. The apparatus for wave soldering an element according to claim 13 wherein the conveyor means comprises a conveyor for supporting a plurality of elements resting on pallets.

21. The apparatus for wave soldering an element according to claim 13 wherein the conveyor means comrises a first conveyor for moving the element from the entry through the solder wave, and a second conveyor for moving the element to the exit.

22. The apparatus for wave soldering an element according to claim 13 including a second discharge nozzle and second means for forming a solder wave from the second discharge nozzle within the enclosure.

23. The apparatus for wave soldering an element according to claim 15 wherein the tunnel is formed in sections.

24. The apparatus for wave soldering an element according to claim 13 including gas jet curtains at the entry and exit.

25. The apparatus for wave soldering an element according to claim 15 including a vestibule located at the entry to the tunnel, the vestibule having a first door to place the element therein and a second door at the entry to the tunnel.

26. The apparatus for wave soldering an element according to claim 15 including a vestibule located at the exit from the tunnel, the vestibule having a first door at the exit from the tunnel, and a second door for removing the element.

27. An apparatus for wave soldering an element comprising:
an enclosure including a tunnel for a shield gas atmosphere substantially excluding oxygen with an entry for an element and an exit for the element;
means to maintain the shield gas atmosphere within the enclosure;
a reservoir within the enclosure adapted to contain molten solder;
pump means for forming a solder wave from the nozzle;
a preheating portion in the tunnel before the reservoir and a cooling portion in the tunnel after the reservoir;
means for moving the element in a predetermined path through the enclosure from the entry to the exit, the path ensuring at least a portion of the element passes through the solder wave; and
oscillating means to produce oscillations in the solder wave during the passage of the element therethrough, the frequency of oscillations being in the range of about 20 to 400 Hertz;
spray means in the tunnel prior to the preheating portion, adapted to spray adipic acid solution onto the element.

28. An apparatus for wave soldering an element comprising:
an enclosure including a tunnel for a shield gas atmosphere substantially excluding oxygen with an entry for an element and an exit for the element;
means to maintain the shield gas atmosphere within the enclosure;
a reservoir within the enclosure adapted to contain molten solder;
skirt means extending down from the tunnel into the reservoir to promote a liquid seal when the reservoir contains solder;
pump means for forming a solder wave from the nozzle;
conveyor means for moving the element in a predetermined path through the enclosure from the entry to the exit, the path ensuring at least a portion of the element passes through the solder wave, and
oscillating means to produce oscillations in the solder wave during the passage of the element therethrough, the frequency of oscillations being in the range of about 20 to 400 Hertz.

29. The apparatus for wave soldering according to claim 30 wherein the oscillating means comprises a vane within the discharge nozzle joined to a connecting rod passing out through the skirt means to a vibrator outside the reservoir, and including a seal means between the connecting rod and the skirt means to prevent the escape of shield gas.

* * * * *

UNITED STATES PATENT AND TRADEMARK OFFICE
CERTIFICATE OF CORRECTION

PATENT NO. : 5,044,542

DATED : September 3, 1991

INVENTOR(S) : Carlos A. Deambrosio

It is certified that error appears in the above-identified patent and that said Letters Patent is hereby corrected as shown below:

Col. 8, claim 6, line 2, "15" should read --2--.

Col. 9, claims 14, 17-22 and 24, line 2, "13" should read --12--.

Col. 9, claims 15, 16, 23, 25 and 26, line 2, "15" should read --14--.

Col. 10, claim 29, line 2, "30" should read --28--.

Signed and Sealed this

Second Day of March, 1993

Attest:

STEPHEN G. KUNIN

Attesting Officer

Acting Commissioner of Patents and Trademarks

UNITED STATES PATENT AND TRADEMARK OFFICE
CERTIFICATE OF CORRECTION

PATENT NO. : 5,044,542
DATED : September 3, 1991
INVENTOR(S) : CARLOS A. DEAMBROSIO It is certified that error appears in the above—identified patent and that said Letters Patent is hereby corrected as shown below:

Claims 12, 27 and 28 should read as follows:
Col. 8, line 49:

12. An apparatus for wave soldering an element comprising:

an enclosure for a shield gas atmosphere substantially excluding oxygen with an entry for an element and an exit for the element;

means to maintain the shield gas atmosphere within the enclosure;

a reservoir within the enclosure adapted to contain molten solder;

<u>at least one discharge nozzle facing upwards positioned above the reservoir;</u> pumps means for forming a solder wave from the nozzle;

means for moving the element in a predetermined path through the enclosure from the entry to the exit, the path ensuring at least a portion of the element passes through the solder wave; and oscillating means to produce oscillations in the solder wave during the passage of the element therethrough, the frequency of oscillations being in the range of about 20 to 400 Hertz.

UNITED STATES PATENT AND TRADEMARK OFFICE
CERTIFICATE OF CORRECTION

PATENT NO. : 5,044,542

DATED : September 3, 1991

INVENTOR(S) : CARLOS A. DEAMBROSIO

It is certified that error appears in the above-identified patent and that said Letters Patent is hereby corrected as shown below:

Column 10, line 3;

27. An apparatus for wave soldering an element comprising:

an enclosure including a tunnel for a shield gas atmosphere substantially excluding oxygen with an entry for an element and an exit for the element;

means to maintain the shield gas atmosphere within the enclosure;

a reservoir within the enclosure adapted to contain molten solder;

<u>at least one discharge nozzle facing upwards positioned above the reservoir;</u> pump means for forming a solder wave from the nozzle;

means for moving the element in a predetermined path through the enclosure from the entry to the exit, the path ensuring at least a portion of the element passes through the solder wave; and oscillating means to produce oscillations in the solder wave during the passage of the element therethrough, the frequency of oscillations being in the range of about 20 to 400 Hertz.

UNITED STATES PATENT AND TRADEMARK OFFICE
CERTIFICATE OF CORRECTION

PATENT NO.  : 5,044,542

DATED       : September 3, 1991

INVENTOR(S) : CARLOS A. DEAMBROSIO

It is certified that error appears in the above-identified patent and that said Letters Patent is hereby corrected as shown below:

Column 10, line 28:

28. An apparatus for wave soldering an element comprising:

an enclosure including a tunnel for a shield gas atmosphere substantially excluding oxygen with an entry for an element and an exit for the element;

means to maintain the shield gas atmosphere within the enclosure;

a reservoir within the enclosure adapted to contain molten solder;

<u>at least one discharge nozzle facing upwards positioned above the reservoir;</u> skirt means extending down from the tunnel into the reservoir to promote a liquid seal when the reservoir contains solder;

pump means for forming a solder wave from the nozzle;

conveyor means for moving the element in a predetermined path through the enclosure from the entry to the exit, the path ensuring at least a portion of the element passes through the solder wave; and

UNITED STATES PATENT AND TRADEMARK OFFICE
CERTIFICATE OF CORRECTION

PATENT NO. : 5,044,542

DATED : September 3, 1991

INVENTOR(S) : CARLOS A. DEAMBROSIO

It is certified that error appears in the above-identified patent and that said Letters Patent is hereby corrected as shown below:

oscillating means to produce oscillations in the solder wave during the passage of the element therethrough, the frequency of oscillations being in the range of about 20 to 400 Hertz.

Signed and Sealed this

Twentieth Day of April, 1993

Attest:

MICHAEL K. KIRK

*Attesting Officer*    Acting Commissioner of Patents and Trademarks